United States Patent
Heismann et al.

(10) Patent No.: US 6,420,955 B2
(45) Date of Patent: Jul. 16, 2002

(54) RESISTIVE SHORT-CIRCUIT CURRENT LIMITER HAVING A CONDUCTOR TRACK STRUCTURE MADE OF HIGH-TEMPERATURE SUPERCONDUCTOR MATERIAL, AND METHOD OF PRODUCING THE CURRENT LIMITER

(75) Inventors: Björn Heismann, Erlangen; Hans-Peter Krämer, Herzogenaurach, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/761,239

(22) Filed: Jan. 17, 2001

Related U.S. Application Data

(63) Continuation of application No. PCT/DE99/07065, filed on Jul. 5, 1999.

(30) Foreign Application Priority Data

Jul. 17, 1998 (DE) .......................................... 198 32 274

(51) Int. Cl.$^7$ ................................................. H01C 7/00
(52) U.S. Cl. ........................ 338/13; 338/32 S; 338/292; 338/293; 338/300; 515/220
(58) Field of Search .......................... 338/13, 325, 292, 338/293, 300; 515/220; 361/19

(56) References Cited

U.S. PATENT DOCUMENTS 3,054,978 A * 9/1962 Schmidlin .................. 338/32 S
3,715,703 A * 2/1973 Crosco et al. ............. 338/32 S

FOREIGN PATENT DOCUMENTS

DE       44 34 819 C1    1/1996
DE       195 20 205 A1    12/1996
EP       0 523 374 A1    6/1992

OTHER PUBLICATIONS

Japanese Patent Abstract No. 09219928 (Yuki et al.), dated Aug. 19, 1997.
Japanese Patent Abstract No. 01039229 (Satoru), dated Feb. 9, 1989.

* cited by examiner

*Primary Examiner*—Karl D. Easthom
(74) *Attorney, Agent, or Firm*—Laurence A. Greenberg; Werner H. Stemer; Ralph E. Locher

(57) ABSTRACT

The resistive current limiter contains an electrically insulating support body and at least one conductor track structure arranged thereon and having a conductor track made of high-$T_c$ superconductor material. The conductor track has straight and curved conductor track segments. A maximum radii ratio v of 7 ($v=r_a/r_i$ where $r_a$=external radius, $r_i$=internal radius) is to be maintained for the curved conductor track segments. The conductor track is advantageously patterned from a layer which is made of the high-$T_c$ superconductor material and is applied on the support body.

17 Claims, 2 Drawing Sheets

RESISTIVE SHORT-CIRCUIT CURRENT LIMITER HAVING A CONDUCTOR TRACK STRUCTURE MADE OF HIGH-TEMPERATURE SUPERCONDUCTOR MATERIAL, AND METHOD OF PRODUCING THE CURRENT LIMITER

CROSS-REFERENCE TO RELATED APPLICATION

This application is a continuation of copending International Application No. PCT/DE99/02065, filed Jul. 5, 1999, which designated the United States.

BACKGROUND OF THE INVENTION

Field of the Invention

The invention relates to a resistive short-circuit current limiter having a support body which is at least partially composed of electrically insulating material, having at least one conductor track structure with high-$T_c$ superconductor material, which structure is arranged on the support body and contains at least one conductor track having a plurality of first conductor track segments extending essentially rectilinearly and having a plurality of second conductor track segments extending non-rectilinearly, and also having end pieces of the conductor track structure for the latter to make contact with connecting conductors. The invention furthermore relates to a method for producing such a short-circuit current limiter. A corresponding short-circuit current limiter and also a method for producing it are described in European published patent application EP 0 523 374 A.

In electrical alternating-current supply systems, it is not possible reliably to avoid short circuits and electrical flashovers. The alternating current in the affected circuit then rises very quickly, i.e. in the first half-cycle of the current, to a multiple of its nominal value until it is interrupted by suitable protection and/or switching means. As a consequence of this, considerable thermal and mechanical stresses due to electromechanical forces occur in all system components affected, such as lines and busbars, switches or transformers. Since these short-term loads increase with the square of the current, reliable limiting of the short-circuit current to a lower peak value can considerably reduce the requirements made of the load-carrying capability of these system components. As a result, cost advantages can be achieved, for instance when constructing new systems and extending existing systems, in that a replacement of system components by embodiments with higher load-carrying capability can be avoided by installing current limiters.

Using superconducting short-circuit current limiters of the resistive type, the current rise after a short circuit can be limited to a value of a few multiples of the nominal current; furthermore, such a limiter is operational again a short time after disconnection. Thus, it acts like a fast self-healing fuse. It also ensures high operational reliability since it acts passively, i.e. operates autonomously without previous detection of the short circuit and without active triggering by a switching signal.

Resistive superconducting short-circuit current limiters of the type mentioned in the introduction form a superconducting break to be inserted serially into a circuit. In this case, the transition of a superconducting conductor track structure of this limiter from the practically resistanceless cold operating state below the critical temperature $T_c$ of the superconductor material used into the normally conductive state above $T_c$ (so-called phase transition) is utilized, in which case the electrical resistance Rn then present in the conductor track structure limits the current to an acceptable magnitude $I=U/R_n$. The heating above the critical temperature $T_c$ is done by Joule heat in the superconductor material of the conductor track structure itself when, after a short circuit, the current density j rises above the critical value $j_c$ of the superconductor material, where the material may already have a finite electrical resistance even below the critical temperature $T_c$. In the limiting state above the critical temperature $T_c$, a residual current continues to flow in the circuit containing the short-circuit current limiter, until an additional mechanical isolator completely interrupts the circuit.

Superconducting short-circuit current limiters with known metal-oxide high-$T_c$ superconductor materials (abbreviated to HTS materials), the critical temperature $T_c$ of which is so high that they have to be kept in the superconducting operating state using liquid nitrogen of 77K, exhibit a fast increase in the electrical resistance when the critical current density $j_c$ is exceeded. The heating during the transition into the normally conductive state and thus the current limiting occur in a comparatively short time, so that the peak value of the short-circuit current can be limited to a fraction of the unlimited current, for instance to 3 to 10 times the nominal current. The superconducting current path of the short-circuit current limiter is in contact with a coolant which is capable of returning it to the superconducting operating state in a comparatively short time after the critical current density $j_c$ has been exceeded.

The resistive short-circuit current limiter which operates correspondingly and can be found in the above-mentioned publication EP 0 523 374 A contains a conductor track structure in the form of an electrical conductor made of an HTS material. The conductor is wound in a meandering shape and, for example, is worked from a 5 mm thick plate of the HTS material by means of lateral slotting. The conductor is therefore composed of first conductor track segments, which extend practically rectilinearly and are parallel to one another, and conductor track segments which extend transversely with respect to the rectilinear conductor track segments and connect the latter. The conductor thus forms a bent or angled conductor track in the mutual connection region at the end of the first, rectilinear conductor track segments, which conductor track can be regarded there as a second conductor track segment extending non-rectilinearly. The entire conductor may be designed to be self-supporting; however, it may also be situated on a support body in order to increase its mechanical stability. The end pieces of the conductor are designed as contact pieces to which external connecting conductors can be connected for the purpose of feeding in the current to be limited.

In the case of a superconducting short-circuit current limiter of this type, the problem arises that at the bend points of the conductor track between a rectilinearly extending (first) conductor track segment and the conductor track segment extending transversely with respect thereto and connecting such rectilinear conductor track segments, the current distribution and thus the thermal loading in the limiting case are inhomogeneous. It has therefore been considered to be necessary heretofore to use the conductor track of known short-circuit current limiters only for correspondingly lower switching capacities; or it was necessary to overdimension the non-rectilinear (second) conductor track segments such that they did not have an undesirable power limiting function. In the latter case, however, the area utilization of the surface of the support body was then correspondingly unfavorable.

SUMMARY OF THE INVENTION

The object of the present invention is to provide a short-circuit current limiter with a conductor track formed of high-temperature superconductor material of the type mentioned in the introduction which overcomes the above-noted deficiencies and disadvantages of the prior art devices and methods of this general kind, and to the effect that it can be used to provide a comparatively higher maximum switching capacity, without necessitating over-dimensioning of conductor track segments. It is a further object of the invention to specify a method for the simplest possible production of such a limiter.

With the above and other objects in view there is provided, in accordance with the invention, a resistive short-circuit current limiter, comprising:

a support body at least partially composed of electrically insulating material;

a conductor track structure with high-$T_c$ superconductor material disposed on the support body, the conductor track structure having at least one conductor track with a plurality of first conductor track segments extending substantially rectilinearly, a plurality of second conductor track segments extending non-rectilinearly, and end pieces of the conductor track structure for contacting connecting conductors;

the second conductor track segments forming an arc with a maximum radii ratio $v=r_a/r_i$ of 7, where $r_a$ is an outer radius and $r_i$ an inner radius of the arc of the respective conductor track segment.

There is also provided, in accordance with the invention, a method of producing such a resistive short-circuit current limiter. In the method, a layer of high-$T_c$ superconductor material is deposited directly or indirectly on the support body, and the layer is patterned to form a conductor track structure having at least one conductor track with a plurality of first conductor track segments extending substantially rectilinearly and a plurality of second conductor track segments extending non-rectilinearly along an arc having an outer radius $r_a$ and an inner radius $r_i$ and a maximum radii ratio $v=r_a/r_i$ of 7.

According to the invention, the above objects are achieved with respect to the short-circuit current limiter in that all the second conductor track segments extending non-rectilinearly are configured arcuately with a maximum radii ratio $v=r_a/r_i$ of 7. Transition pieces or end pieces at the ends of the at least one conductor track for making contact with connecting conductors are in this case not intended to be included in the dimensioning, according to the invention, of the maximum radii ratio.

The particular advantages associated with this configuration of the short-circuit current limiter are to be seen in the fact that upon maintaining the specified geometrical criterion for the second, arcuate conductor track segments, the inhomogeneous local loading is reduced to a tolerable amount, without significantly impairing the area utilization. This is because the excessive increase in temperature at the internal radius relative to the external radius $T(r_i)/T(r_a)$ during the switching of the corresponding conductor track segment is limited to a maximum of $v^2$.

Preferably, a maximum radii ratio $v=r_a/r_i$ of 6, in particular of 5, is chosen. At these values, the risk of an undesirable temperature increase can practically be precluded for customary conductor track widths.

For reasons of good area utilization, it is particularly favorable if all the second, arcuate conductor track segments have a (minimum) radii ratio v of at least 2.5, preferably of at least 3. Although smaller values of v, and hence larger internal radii, reduce the excessive increase in temperature, they also impair the area utilization.

For the same reasons, all the second, arcuate conductor track segments advantageously have at least approximately the same conductor track width as the first, rectilinear conductor track segments.

Consequently, in practice, a range of the radii ratio v of all the second conductor track segments of between 3 and 6 represents a good compromise between excessive increase in temperature and area utilization.

A support body made of a special glass material is advantageously chosen for the short-circuit current limiter according to the invention, particularly when a large-area construction is involved.

An advantageous method for producing a short-circuit current limiter according to the invention is wherein the at least one conductor track is formed by patterning at least one layer which is made of the high-$T_c$ superconductor material and is applied directly or indirectly on the support body. The individual conductor track segments can be designed in a comparatively simple manner using conventional physical, mechanical and/or chemical patterning processes.

Further advantageous configurations of the short-circuit current limiter according to the invention and, respectively, of the method for producing it emerge from the dependent claims in each case.

Other features which are considered as characteristic for the invention are set forth in the appended claims.

Although the invention is illustrated and described herein as embodied in a resistive short-circuit current limiter having a conductor track structure made of high-$T_c$ superconductor material, and method for producing the current limiter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

Structurally and functionally corresponding parts are identified with the same reference symbols throughout the figures.

DESCRIPTION OF THE PREFERRED EMBODIMENTS

Figure 1:
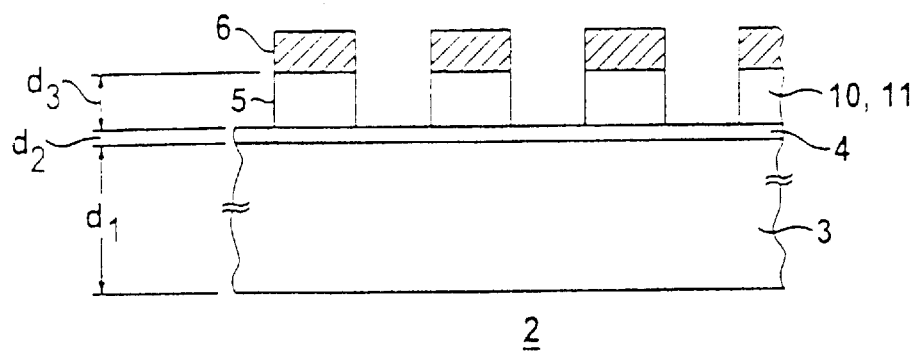
FIG. 1 is a partial cross sectional view through a short-circuit current limiter according to the invention.

Referring now to the figures of the drawing in detail and first, particularly, to FIG. 1 thereof, there is seen a short-circuit current limiter according to the invention that is based on embodiments of such limiters as they are known per se. See, for instance, EP 0 523 374 A (see above) and German published patent application DE 195 20 205 A. The basic construction of the limiter is indicated in FIG. 1 as a detail from a cross section through the most essential part of such a limiter. This construction of the limiter, which is generally designated by 2, comprises a substrate or support body 3 having a thickness $d_1$ and, if appropriate, at least one intermediate layer 4 which is applied thereto and has a thickness $d_2$. This intermediate layer shall be regarded as part of the support body hereinafter. It has applied to it or deposited on it a layer 5 made of an HTS material having a thickness $d_3$, which is patterned according to the invention. The HTS layer may be covered with at least one further covering layer such as, for example, a protective layer or a layer 6 preferably serving as a shunt resistor. A shunt resistor layer made of metal is particularly advantageous for current limiter applications, in particular in the case where an insulating support body is used.

The support body 3 may be formed by a planar or, if appropriate, also by a curved, such as e.g. tubular, substrate body. It is composed at least partially of an electrically insulating material. Materials suitable for this purpose are ceramics such as e.g. MgO, $SrTiO_3$, $Al_2O_3$ or Y-stabilized $ZrO_2$ (abbreviated to YSZ). Particularly advantageously, support bodies made of special glass materials are provided, in particular when large-area conductor track structures are involved. A corresponding plate made of a particular flat glass may, for example, have a thickness $d_1$ of a few millimeters. In addition, support bodies composed of metallic and, thereon, electrically insulating material are also suitable. In particular in the case where metallic parts are used for the support body, the intermediate layer 5 made of an electrically insulating material is required. Such an intermediate layer may also be needed as a so-called buffer layer in order, on the one hand, to prevent an interaction between the HTS material to be applied to it and the support body material and, on the other hand, to promote a texture of the HTS material to be applied. Known buffer layer materials, which are generally applied to a thickness $d_2$ of between 0.1 and 2 $\mu$m, are YSZ, YSZ+$CeO_2$ (as double layer), YSZ+Sn-doped $In_2O_3$ (as a double layer), $CeO_2$, $Pr_6O_{11}$, MgO, $SrTiO_3$ or $La_{1-x}Ca_xMnO_3$.

All known metal-oxide high-$T_c$ superconductor materials such as, in particular, $YBa_2Cu_3O_{7-x}$ or $RBa_2Cu_3O_{7-x}$ (where R=rare earth metal), $TlBa_2Ca_2Cu_3O_{9+x}$, $HgBa_2CaCu_2O_{6+}$, $Bi_2Sr_2CaCu_2O_{8+x}$ $(Bi,Pb)_2Sr_2Ca_2Cu_3O_{11-x}$ can be used as HTS materials for the layer 5. It goes without saying that individual components or a plurality of components of these materials can be partially or completely substituted by other elements in a manner known per se. The HTS layer is applied on the support body 3 or the intermediate layer 4 covering it, with a thickness $d_3$ of up to a few $\mu$m, using conventional processes.

As is also indicated in FIG. 1, at least the HTS layer 5 is intended to be configured in a particular manner to form a conductor track structure 10. All known physical or else chemical patterning processes can be used for this purpose. By way of example, the patterning can be performed by means of a laser.

Figure 2:
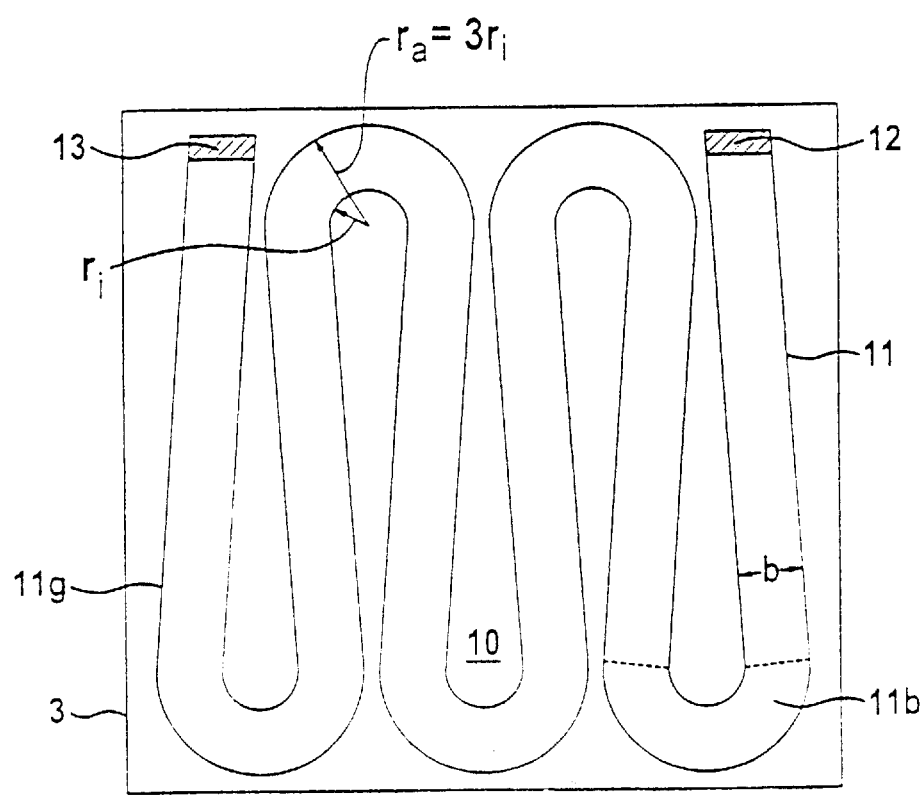
FIGS. 2 to 4 are plan views of different configuration possibilities for conductor track structures of such a short-circuit current limiter.

A configuration possibility for the conductor track structure 10 is illustrated in plan view in FIG. 2. This conductor track structure is formed by a meander-shaped conductor track 11 composed of first conductor track segments 11g, extending at least largely rectilinearly, and second, arcuately configured conductor track segments 11b. At its ends, the conductor track is configured as end pieces 12 and 13, which are to make contact with connecting conductors.

According to the invention, all the arcuate conductor track segments 11b are intended to fulfill a particular geometrical criterion. This criterion is determined by a maximum radii ratio $v=r_a/r_i$, where $r_a$ is the outer radius and $r_i$ the inner radius of the respective arcuate section. In other words, each arcuate conductor track segment is intended to have a radii ratio v whose value is at most the afore-mentioned maximum value (or less). In this case, it is advantageously assumed that in the region of its arcuate conductor track segments 11b, the conductor track 11 has, at least approximately, preferably the same width b as in the region of the rectilinear conductor track segments 11g, so that the following holds true: $r_a-r_i=b$. For a predetermined conductor track width b, the criterion is then equivalent to the introduction of a minimum internal radius $r_{i,min}$, since $v=1+b/r_{i,min}$. This criterion ensures that the excessive increase in temperature $T(r_i)/T(r_a)$ at the internal radius $r_i$ relative to the external radius $r_a$ during the switching of the arcuate conductor track segment is limited to a maximum of $v^2$. In this case, although smaller values of v and hence larger internal radii reduce the excessive increase in temperature, they also impair the area utilization of the covering of the surface of the support body 3 with superconductor material. It has been shown that values of v of between 2.5 and 7, in particular of between 3 and 6, represent a good compromise between excessive increase in temperature and area utilization. For this reason, according to the invention, a value of v=7 should not be exceeded as maximum radii ratio, and, preferably, a value v of maximally 6, in particular of maximally 5, is chosen. A value v of less than 2.5 for all the second, curved conductor track segments is less expedient. In the case of the embodiment of the conductor track structure 10 which is shown in FIG. 2, v=3.

Figure 3:
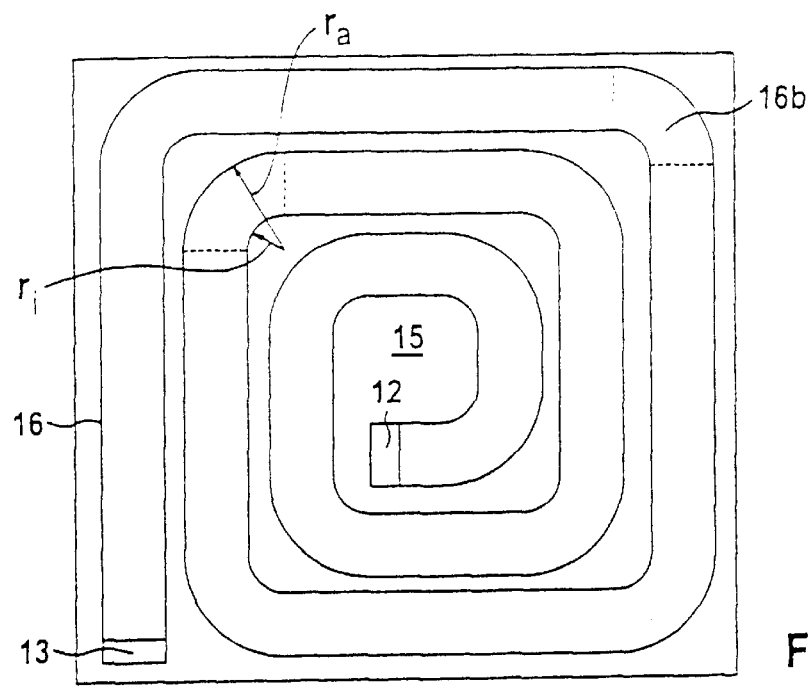
Figure 4:
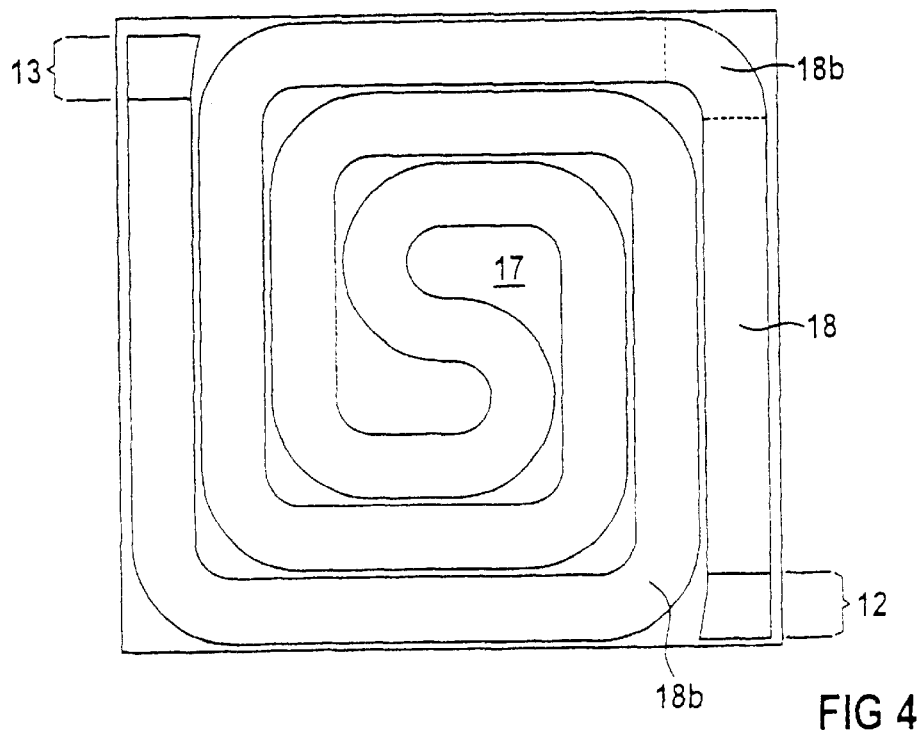

It is also the case for the embodiments of conductor track structures 15 and 17 which are indicated in FIGS. 3 and 4, respectively, that a maximum radii ratio v of 3 is provided for curved conductor track segments 16b and 18b, respectively, of their conductor tracks 16 and 18, respectively. In this case, the conductor track 16 according to FIG. 3 describes a spiral form running from the outer position inward, with a central end piece 12 and an outer end piece 13. The conductor track 18 shown in FIG. 4 describes a spiral form leading from the outer position inward and back outward again, so that its end pieces 12 and 13 are each located at outer positions.

In the embodiments of short-circuit current limiters according to the invention, explained with reference to the figures, it was assumed that their conductor track structures are in each case applied only on one side of a support body. It goes without saying that it is also possible to cover the opposite areas of the support body on both sides with a single conductor track structure or else with a plurality of conductor track structures.

We claim:

1. A resistive short-circuit current limiter, comprising:
   a support body at least partially composed of electrically insulating material;
   a conductor track structure with high-$T_c$ superconductor material disposed on said support body, said conductor track structure having at least one conductor track with a plurality of first conductor track segments extending substantially rectilinearly, a plurality of second conductor track segments extending non-rectilinearly, and end pieces of said conductor track structure for contacting connecting conductors;
   said second conductor track segments forming an arc with a radii ratio $v=r_a/r_i$ of at least 2.5, and a maximum radii ratio $v=r_a/r_i$ of 7, where $r_a$ is an outer radius and $r_i$ an inner radius of the arc of the respective conductor track segment.

2. The short-circuit current limiter according to claim 1, wherein the maximum radii ratio v is 6.

3. The short-circuit current limiter according to claim 1, wherein the maximum radii ratio v is 5.

4. The short-circuit current limiter according to claim 3, wherein the radii ratio v of all said second conductor track segments is between 3 and 6.

5. The short-circuit current limiter according to claim 1, wherein all said second conductor track segments have a radii ratio $v=r_a/r_i$ of at least 3.

6. The short-circuit current limiter according to claim 1, wherein said second conductor track segments have a conductor track width substantially identical to a conductor track width as said first conductor track segments.

7. The short-circuit current limiter according to claim 1, wherein said support body is composed of a ceramic material.

8. The short-circuit current limiter according to claim 1, wherein said support body is composed of a glass material.

9. The short-circuit current limiter according to claim 1, wherein said support body includes at least one intermediate layer supporting said conductor track structure.

10. The short-circuit current limiter according to claim 1, which comprises a further layer covering said conductor track structure.

11. The short-circuit current limiter according to claim 10, wherein said covering layer is a metal layer acting as a shunt resistor.

12. The short-circuit current limiter according to claim 1, wherein said conductor track structure is one of two conductor track structures each disposed on a respective side of said support body.

13. A method of producing a resistive short-circuit current limiter, which comprises:

providing a support body at least partially composed of electrically insulating material;

depositing a layer of high-$T_c$ superconductor material on the support body;

patterning the layer to form a conductor track structure having at least one conductor track with a plurality of first conductor track segments extending substantially rectilinearly and a plurality of second conductor track segments extending non-rectilinearly along an arc having an outer radius $r_a$ and an inner radius $r_i$ and a radii ratio $v=r_a/r_i$ of at least 2.5, and a maximum radii ratio $v=r_a/r_i$ of 7.

14. The method according to claim 13, wherein the depositing step comprises forming the layer of high-$T_c$ superconductor material directly on the support body.

15. The method according to claim 13, wherein the depositing step comprises forming the layer of high-$T_c$ superconductor material indirectly on the support body.

16. The method according to claim 13, wherein the patterning step comprises performing a physical patterning process.

17. The method according to claim 13, wherein the patterning step comprises performing a chemical patterning process.

* * * * *

UNITED STATES PATENT AND TRADEMARK OFFICE
CERTIFICATE OF CORRECTION

PATENT NO.    : 6,420,955 B2
DATED         : July 16, 2002
INVENTOR(S)   : Björn Heismann et al.

It is certified that error appears in the above-identified patent and that said Letters Patent is hereby corrected as shown below:

<u>Title page,</u>
Item [63], should read as follows:
-- Continuation of application No. PCT/DE99/02065, filed on Jul. 5, 1999 --

Signed and Sealed this

Fifth Day of November, 2002

*Attest:*

*Attesting Officer*

JAMES E. ROGAN
*Director of the United States Patent and Trademark Office*